United States Patent [19]

Broyde et al.

[11] Patent Number: 5,068,616

[45] Date of Patent: Nov. 26, 1991

[54] MONITORING PROCESS AND DEVICE OF A QUASI-CLOSED ELECTROMAGNETIC SHIELD

[75] Inventors: Frédéric Broyde, Rueil Malmaison; Michel Barrault, Saint Ismier, both of France

[73] Assignee: Merlin Gerin, Grenoble, France

[21] Appl. No.: 387,820

[22] Filed: Aug. 1, 1989

[30] Foreign Application Priority Data

Aug. 5, 1988 [FR] France .................... 88 10718

[51] Int. Cl.$^5$ ............................................. G01R 31/02
[52] U.S. Cl. .................................... 324/627; 324/616; 324/603; 375/1
[58] Field of Search ................ 375/1; 370/18; 380/33; 324/627, 628, 616, 603

[56] References Cited

U.S. PATENT DOCUMENTS

| | | | |
|---|---|---|---|
| 3,492,568 | 1/1970 | Johnson | 324/627 |
| 4,319,358 | 3/1982 | Sepp | 375/1 |
| 4,335,463 | 6/1982 | Foucard | 375/1 |
| 4,759,034 | 7/1988 | Nagazumi | 375/1 |
| 4,962,358 | 10/1990 | Svetanoff | 324/627 |
| 4,973,911 | 11/1990 | Marshall | 324/628 |

FOREIGN PATENT DOCUMENTS 0246460 11/1987 European Pat. Off. .

OTHER PUBLICATIONS

Electro Conf. Record "EMI Testing of Metalized Plastics", 8079 vol. 4 (1979-04-24/26) by Robert D. Goldblum, pp. 1-7.

8049 IEE Proceedings Sections A a I "Optically Coupled Probe for Microwave Near-Field Measurements", by Rousseau et al., pp. 74-78 (1984).

IEEE Antennas & Propagation Society Newsletter, "Photonic Sensors for Electromagnetic Field Measurements", by Wyss, pp. 1-43, (1984).

1986 IEEE International Symposium on Electromagnetic Compatibility, "Measurement of Seam Impedances of Tactical Shelters for Threat Level Nemp Simulation", by Papazian et al., pp. 416-422.

Primary Examiner—Kenneth A. Wieder
Assistant Examiner—Jose M. Solis
Attorney, Agent, or Firm—Parkhurst, Wendel & Rossi

[57] ABSTRACT

An emitter assembly of low-power electromagnetic signals with random or pseudo-random frequency variation is located inside an electromagnetic shield to be monitored. These signals are detected by at least one synchronous detection receiver located outside the shield, a second transmission channel, preferably constituted by an optic fiber, connecting the emitter and receiver assemblies to enable synchronous detection of signals transmitted via an electromagnetic channel through the shield. The amplitude of the electromagnetic signals received by the detector is significant of the quality of the shielding.

8 Claims, 1 Drawing Sheet

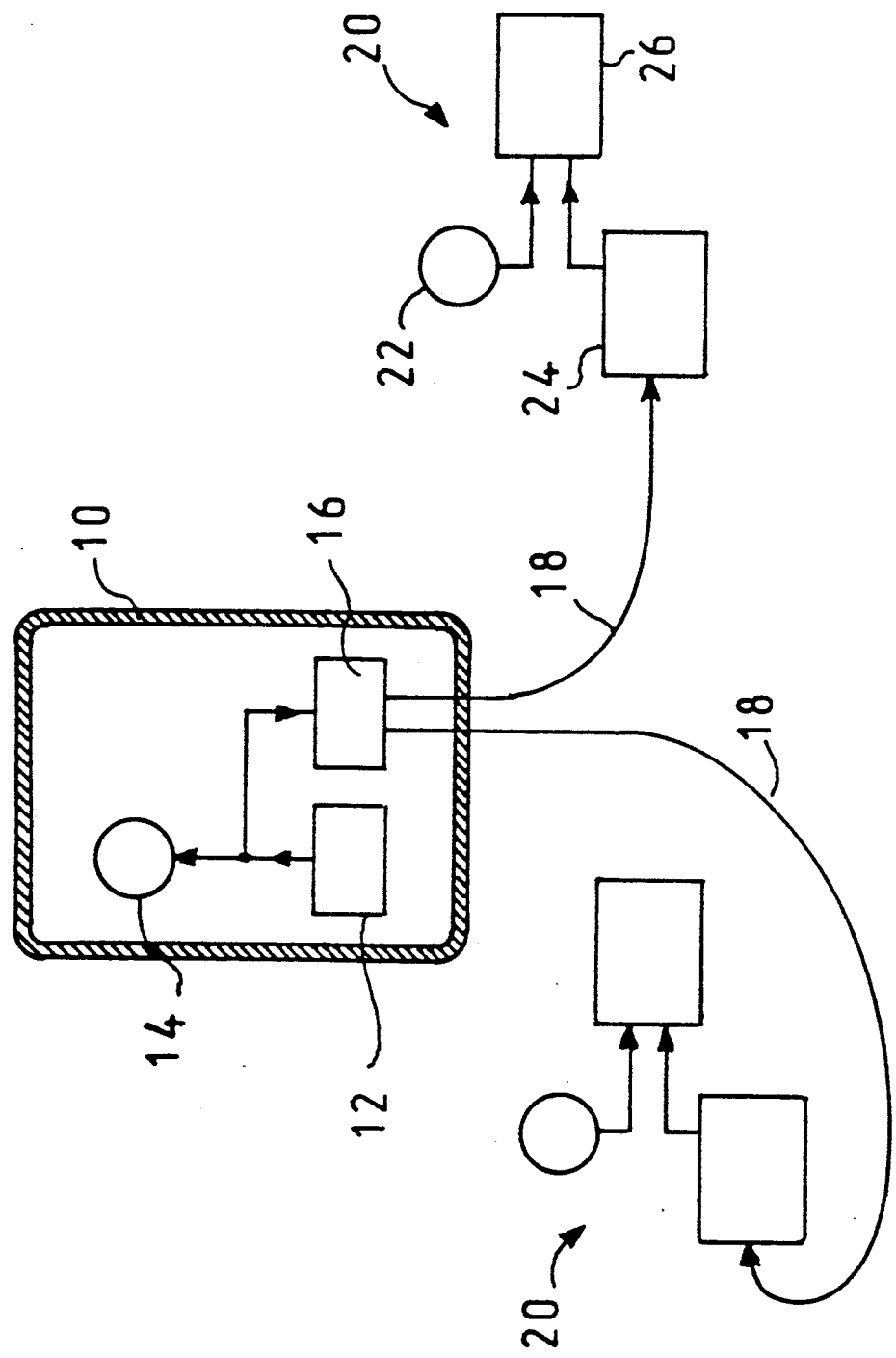

MONITORING PROCESS AND DEVICE OF A QUASI-CLOSED ELECTROMAGNETIC SHIELD

BACKGROUND OF THE INVENTION

The invention relates to a monitoring process of a quasi-closed electromagnetic shield comprising emission, inside the shield, of electromagnetic signals and detection by at least one receiver assembly located outside the shield of the electromagnetic signals transmitted through the shield, and to a device for implementing this process.

Shielding techniques of premises, for example by means of a Faraday cage, to protect equipment against electromagnetic interference of external origin are widely used. However, this protection is only properly achieved if the movable contacts designed to provide the electromagnetic tightness at the level of the openings, such as doors and windows, are in good condition.

The inevitable ageing of these contacts makes it necessary to check the quality of the shielding periodically. It is a state-of-the-art technique (first process) to determine the efficiency of a shielding constituted by a quasi-closed electromagnetic shield by measuring outside the latter, by means of a selective measuring device, the electromagnetic field produced by a generator of an A.C. current of predetermined frequency whose output is connected to a frame antenna, the antenna and generator being located inside the shield. A similar device wherein the measuring device is inside the shield, and the antenna-generator assembly outside the shield is also state-of-the-art (second process). The frequencies generally used are comprised between 1 kHz and 100 kHz, for at these frequencies the usual electromagnetic shields do not give good performances. To give an example, the attenuation due to the shield is typically 80 dB at 100 kHz, 60 dB at 10 kHz and 40 dB at 1 kHz. The electromagnetic waves passing through the shield can thus easily be measured outside, the decrease of the attenuation being representative of the quality of the shielding.

SUMMARY OF THE INVENTION

The object of the invention is to achieve a continuous monitoring process and device enabling any malfunctioning of the electromagnetic shield to be detected.

Continuous use of one of the state-of-the-art processes is not advisable for it involves a large electromagnetic radiation to the outside, in the event of a shielding fault for the first process, and in all cases for the second process. This is to be avoided for electromagnetic pollution reasons and, for certain applications, notably for military applications, for security reasons. The electromagnetic radiation produced by the device according to the invention must therefore be undetectable by any equipment located outside the shield other than the monitoring device receiver assembly. It is moreover preferable for this radiation to be as low as possible so as not to interfere with the equipment to be protected, located inside the shield.

According to the invention, this object is achieved by the emission, by an emitter assembly located inside the shield, of low-power electromagnetic signals, with random frequency variation, these signals being transmitted to each receiver assembly by a first transmission channel, of electromagnetic type, a second separate transmission channel, insensitive to the electromagnetic shielding constituted by the shield and not producing any electromagnetic interference, connecting the emitter and receiver assemblies, in such a way as to enable synchronous detection of the signals transmitted via an electromagnetic channel through the shield.

A device for implementing the process according to the invention, comprising an electromagnetic signal emitter assembly housed inside the shield and at least one receiver assembly located outside the shield and designed to perform a selective electromagnetic measurement is characterized in that the emitter assembly comprises a low-power signal generator with random or pseudo-random frequency variation, whose output signals are transmitted to each receiver assembly by a first transmission channel, of electromagnetic type, going from an emitter antenna of the emitter assembly connected to the generator output, to a receiver antenna of the receiver assembly connected to a first input of a synchronous detection receiver, a second transmission channel, insensitive to the electromagnetic shielding constituted by the shield and not producing any electromagnetic interference, connecting the emitter and receiver assemblies in such a way as to enable synchronous detection of the signals transmitted by electromagnetic channel through the shield.

When the generator is a random frequency generator, the second transmission channel transmits the generator output signals to a second, phase reference input of the synchronous detection receiver. When the generator is a pseudo-random frequency generator controled by a control device connected to the emitter assembly and to the synchronous detection receiver, the second transmission channel connects the emitter assembly to the control device when the latter is located outside the shield and the receiver assembly to the control device when the latter is located inside the shield.

The second transmission channel is preferably an optic transmission channel using at least one optic fiber passing through the shield.

According to a development of the invention the emitter assembly comprises a plurality of outputs respectively connected by an associated optic fiber to a corresponding receiver assembly.

The frequency of the signals emitted by the generator varies within a range comprised between 1 and 100 kHz.

BRIEF DESCRIPTION OF THE DRAWINGS

Other advantages and features will become more clearly apparent from the following description of an illustrative embodiment of the invention, given as a non-restrictive example only and represented in the single drawing, schematically representing a monitoring device according to the invention.

DESCRIPTION OF THE PREFERRED EMBODIMENT

Inside a quasi-closed electromagnetic shield 10 to be monitored, there is located an emitter assembly. This device comprises an electrical signal generator 12 with random frequency variation, the instantaneous frequency varying in a range contained within the 1–100 kHz frequency band. The generator output is connected to an emitting antenna 14, of the frame type, and to an electro-optic conversion device 16 supplying on output, on one or more channels, optic signals representative of the electrical signals applied to it. Each output of the conversion device 16 is connected to an optic fiber 18 passing through the shield 10 and connected to an associated receiver assembly 20.

It is obvious that the emitter assembly is represented on a greatly enlarged scale in the figure, as the latter assembly in fact only takes up a very small part of the volume internal to the shield which contains the various items of equipment to be protected against external electromagnetic disturbances.

Two receiver assemblies 20 have been represented in the figure. A monitoring device according to the invention must comprise at least one of these assemblies, but a larger number of identical receiver assemblies can also be provided, each connected to the emitter assembly housed inside the shield by an associated optic fiber 18, the receiver assemblies 20 being arranged at suitable locations around the shield in order to be able to locate any leakage from this shield.

Each receiver assembly 20 comprises a receiver antenna 22, of the frame type, an optic signal receiver device 24, connected to the associated optic fiber 18 and converting the optic signals it receives into electrical signals. The antenna 22 is connected to a signal input of a synchronous detection receiver 26 whose phase reference input is connected to the output of the optic signal receiver device 24.

The monitoring device described above operates as follows:

The generator 12 and emitter antenna 14 continuously produce low-power electromagnetic signals with random frequency variation. These signals can be assimilated to a noise and produce outside the shield a field whose amplitude is lower than the natural noise. This field is therefore undetectable from the outside, except by the receiver assemblies 20. As the frequency varies within a range comprised between 1 and 100 kHz, i.e. in the lower part of the radiofrequency spectrum, and their amplitude is very small, the fields present inside the shield are not liable to disturb the equipment to be protected housed inside the electromagnetic shield, while being detectable from outside by means of a synchronous detection receiver.

To enable synchronous detection of the electromagnetic signals transmitted through the shield 10, transmission is performed via two separate channels. The first transmission channel, from the emitter antenna 14 to the receiver antenna 22, enables signals representative of the quality of the electromagnetic shield to be applied to the synchronous detection receiver signal input 26. The second transmission channel, by optic channel in the preferred embodiment represented in the figure, supplies signals representative of the electromagnetic signals emitted by the emitter assembly located inside the shield to the phase reference input of the synchronous detection receiver. This second transmission channel is insensitive to the shielding and does not emit electromagnetic interference.

The synchronous detection receiver 26 can then detect an extremely weak signal produced by the emitter antenna 14, whereas any other detection device, not receiving the information transmitted by the optic fiber, cannot distinguish these signals from the noise signals produced by other sources.

The quality of the shielding can thus be monitored efficiently and continuously, without the electromagnetic field emitted by the emitter assembly being liable to disturb the equipment to be protected housed inside the shield, and without this field being detectable from the outside by other means than the monitoring device receiver assemblies.

The output signals of the synchronous detection receivers 26, which are representative of the quality of the shielding, can be used in any suitable manner to supply an indication, for example visual or auditory, when a maintenance operation is necessary. These signals can be retransmitted to a processing device located inside the shield by means of optic fiber links (not represented).

According to a second embodiment, not represented, the generator located inside the shield is a signal generator with pseudo-random frequency variation controled by a control device, which can be located either inside or outside the shield. In both cases the second transmission channel, insensitive to the electromagnetic shielding formed by the shield, is used to transmit a signal representative of the synchronization signal supplied by the control device to the generator. If the control device is located inside the shield, this signal is applied to a second input of the synchronous detection receiver which, after decoding, uses it for detection of the signals transmitted via the electromagnetic channel through the shield. When the control device is located outside the shield, it sends the synchronization signal to the generator via the second transmission channel, and is connected to the second input of the synchronous detection receiver of each transmission assembly to which it applies a signal representative of this synchronization signal.

The invention is not limited to a second transmission channel using transmission by optic fiber as described above. Any means enabling signals to be transmitted from inside an electromagnetic shield to the outside or vice-versa without being influenced by the shielding and without emitting electromagnetic interference can be used. Transmission by infrareds, optic beam, ultrasounds, X-rays, or even by a very carefully clad electric cable passing through the shield, can be cited as examples.

We claim:

1. A method for measuring an effectiveness of quasi electromagnetic shield defining a volume enclosing electronic equipment, comprising the steps of:
   generating from inside said shield a random or pseudo-random first signal of lower radio frequency electromagnetic radiation assimilated to a noise level and having a radio frequency between 1 and 100 KHz;
   generating a second signal representative of said first signal;
   providing a receiving means located outside said shield to receive said first and second signals;
   propagating said first signal through said shield to said receiving means;
   propagating said second signal through said shield, in a manner insensitive to said shield, to said receiving means;
   synchronously receiving said first signal at said receiving means, in response to synchronicity information contained in said second signal; wherein said synchronous reception permits said propagated first signal to be distinguished from surrounding noise signals and said first signal is indicative of the effectiveness of said shield.

2. The method of claim 1, wherein said step of generating a first signal, comprises the steps of generating low amplitude electromagnetic radiation.

3. An apparatus for measuring an effectiveness of a quasi electromagnetic shield that defines a volume which encloses electronic equipment, comprising:

generating means located inside said shield for generating random or pseudo-random low amplitude electromagnetic radiation assimilated to a noise level, said electromagnetic radiation having a radio frequency between 1 and 100 KHz;

synchronous receiving means located outside said shield for synchronously receiving said generated electromagnetic radiation;

first communication channel means including transmitting antenna means located within said shield and connected to said generating means and a receiving antenna means located outside said shield and connected to said receiving means for transmitting said electromagnetic radiation from said generating means to said receiving means, said electromagnetic radiation propagating through said shield from said transmitting antenna means to said receiving antenna means; and second communication channel means for communicating a synchronicity signal representative of said electromagnetic radiation from said generating means to said receiving means including means insensitive to said shield for transmitting said representative signals through said shield without emitting electromagnetic interference;

wherein said second communication means simultaneously provides said synchronicity signal to said synchronous receiving means while said generating means generates said electromagnetic radiation so that said receiving means can synchronously receive said electromagnetic radiation transmitted via said first communication channel means; and wherein the magnitude of said electromagnetic radiation transmitted via said first communication channel means through said shield is indicative of the effectiveness of said shield.

4. The apparatus according to claim 3, wherein said generating means is a random frequency generator and said second transmission channel means transmits said synchronicity signal to a phase reference input of said synchronous receiving means.

5. The apparatus according to claim 3, wherein said second communications channel means is an optic transmission channel.

6. The apparatus according to claim 5, wherein said receiving means comprises a plurality of receiving stations and said second communication channel means comprises a plurality of outputs, each of said plurality of outputs being connected by an optic fiber to a corresponding one of said plurality of receiving stations.

7. The apparatus according to claim 3, wherein said second communication channel means is an infrared transmission channel.

8. The apparatus according to claim 3, wherein said second communication channel means is an ultrasound transmission channel.

* * * * *